United States Patent
Qi et al.

(10) Patent No.: US 11,876,568 B2
(45) Date of Patent: Jan. 16, 2024

(54) RADIO FREQUENCY PERFORMANCE TESTING METHOD AND APPARATUS OF WIRELESS DEVICE, AND TESTER

(71) Applicant: GENERAL TEST SYSTEMS INC., Guangdong (CN)

(72) Inventors: Yihong Qi, Guangdong (CN); Wei Yu, Guangdong (CN); Penghui Shen, Guangdong (CN)

(73) Assignee: GENERAL TEST SYSTEMS INC., Guangdong (CN)

( * ) Notice: Subject to any disclaimer, the term of this patent is extended or adjusted under 35 U.S.C. 154(b) by 18 days.

(21) Appl. No.: 17/360,457

(22) Filed: Jun. 28, 2021

(65) Prior Publication Data
US 2021/0399814 A1  Dec. 23, 2021

Related U.S. Application Data

(63) Continuation of application No. PCT/CN2019/113244, filed on Oct. 25, 2019.

(30) Foreign Application Priority Data

Dec. 28, 2018 (CN) .......................... 201811620599.3

(51) Int. Cl.
*H04B 17/29* (2015.01)
*H04B 17/391* (2015.01)
(Continued)

(52) U.S. Cl.
CPC ........... *H04B 17/29* (2015.01); *H04B 7/0417* (2013.01); *H04B 17/18* (2015.01); *H04B 17/3912* (2015.01); *H04W 24/08* (2013.01)

(58) Field of Classification Search
None
See application file for complete search history.

(56) References Cited

U.S. PATENT DOCUMENTS

2015/0054687 A1 * 2/2015 Reed .................... H04B 17/101
                                                                342/361
2016/0226709 A1 * 8/2016 Chen .................... H04B 17/318
(Continued)

FOREIGN PATENT DOCUMENTS

CN       103856272       6/2014
CN       105842546 A  *  8/2016
(Continued)

OTHER PUBLICATIONS

English translation of CN 105842546 (Year: 2022).*
(Continued)

*Primary Examiner* — Gennadiy Tsvey
(74) *Attorney, Agent, or Firm* — Hodgson Russ LLP

(57) ABSTRACT

A method for testing radio frequency performance of a wireless device is provided. Power level reporting information of a device under test is obtained. A propagation matrix is obtained based on the power level reporting information. An inverse matrix is obtained based on the propagation matrix to form a virtual cable between an output port of an instrument and a receiver port of the device under test. A throughput test signal is transmitted through the virtual cable to perform a performance test on the device under test and to obtain a test result of the radio frequency performance.

12 Claims, 12 Drawing Sheets

---

S101: obtains power level reporting information of a device under test

S102: obtains a propagation matrix based on the power level reporting information, obtaining an inverse matrix to be loaded based on the propagation matrix to form a virtual cable between an output port of an instrument and a receiver port of the device under test S103: transmitting a throughput test signal through the virtual cable to perform a performance test on the device under test, and generate a test result of the radio frequency performance

(51) Int. Cl.
  *H04B 17/18* (2015.01)
  *H04B 7/0417* (2017.01)
  *H04W 24/08* (2009.01)

(56) References Cited

U.S. PATENT DOCUMENTS

| | | | | |
|---|---|---|---|---|
| 2017/0373773 | A1* | 12/2017 | Jing | H04B 17/102 |
| 2019/0103926 | A1* | 4/2019 | Chen | H04B 17/102 |
| 2020/0191848 | A1* | 6/2020 | Grossmann | H04B 17/12 |

FOREIGN PATENT DOCUMENTS

| | | |
|---|---|---|
| CN | 107543978 | 1/2018 |
| CN | 108234036 | 6/2018 |
| CN | 108574539 | 9/2018 |
| EP | 3361654 A1 | 8/2018 |

OTHER PUBLICATIONS

English translation of CN 103856272 (Year: 2022).*
Triangle—Wikipedia, retrieved from https://en.wikipedia.org/wiki/Triangle on Apr. 12, 2023 (Year: 2023).*
WIPO, International Search Report and Written Opinion for PCT/CN2019/113244, dated Jan. 15, 2020.
SIPO, First Office Action for CN Application No. 201811620599.3, dated Nov. 13, 2020.
Shen et al., "Inverse Matrix Auto-Search Technique for the RTS MIMO OTA Test—Part 1: Theory," IEEE Transactions on Electromagnetic Compatibility, 2017, vol. 59, No. 6.
EPO, Extended European Search Report for EP Application No. 19905868.6, dated Aug. 29, 2022.
JPO, Office Action for JP Application No. 2021-538050, dated Jul. 26, 2022.
KIPO, Office Action for KR Application No. 10-2021-7023529, dated Aug. 22, 2022.

* cited by examiner

RADIO FREQUENCY PERFORMANCE TESTING METHOD AND APPARATUS OF WIRELESS DEVICE, AND TESTER

CROSS-REFERENCE TO RELATED APPLICATIONS

This application is a continuation of International Application No. PCT/CN2019/113244, filed on Oct. 25, 2019, which claims priority to Chinese Patent Application No. 201811620599.3, filed on Dec. 28, 2018, the entire contents of which are incorporated by reference herein.

TECHNICAL FIELD

The present disclosure relates to a field of performance testing technologies of wireless device, and more particularly, to a method and a device for testing radio frequency performance of wireless device and a related tester.

BACKGROUND

In the related art, usually, a conduction method is adopted to test the radio frequency performance of a wireless device. For example, as illustrated in FIG. 1, antenna performance of the wireless device may be tested through the conduction method, and a conduction cable is connected to a receiver to test performance of the receiver. Therefore, obtained results may be combined as the radio frequency performance of the entire device.

SUMMARY

Embodiments of the present disclosure provide a method for testing radio frequency performance of a wireless device. In one embodiment, the method includes: obtaining power level reporting information of a device under test; obtaining a propagation matrix based on the power level reporting information, and obtaining an inverse matrix loaded based on the propagation matrix to form a virtual cable between an output port of an instrument and a receiver port of the device under test; and transmitting a throughput test signal via the virtual cable to perform a performance test on the device under test and generate a test result of the radio frequency performance.

Embodiments of the present disclosure provide a tester. The tester may obtain the propagation matrix based on the power level reporting information, and form the virtual cable between the output port of the instrument and the receiver port of the device under test, to perform the performance test on the device under test and generate the test result of the radio frequency performance.

Embodiments of the present disclosure provide a non-transitory computer readable storage medium, having instruction stored thereon. When the instructions are executed by a processor, the processor is caused to execute a method for testing radio frequency performance of a wireless device described above.

Additional aspects and advantages of the present disclosure will be given in part in the following description, part of which will become apparent from the following description, or be learned through practice of the present disclosure.

BRIEF DESCRIPTION OF THE DRAWINGS

The above and/or additional aspects and advantages of embodiments of the present disclosure will become apparent and more readily appreciated from the following descriptions made with reference to the drawings, in which.

DETAILED DESCRIPTION

Figure 1:
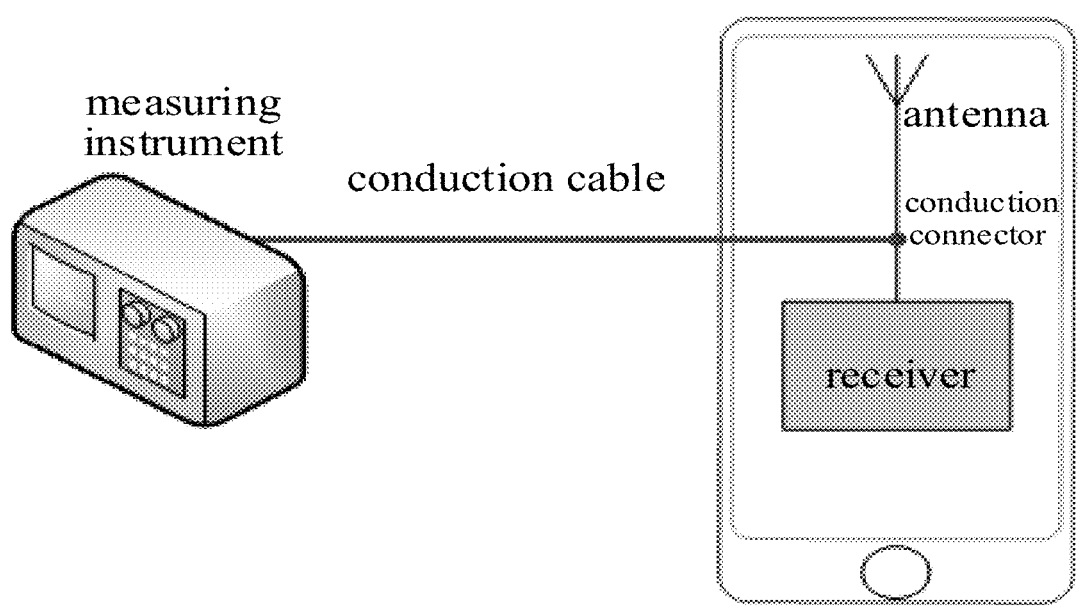
FIG. 1 is a schematic diagram illustrating principles of testing radio frequency performance of a wireless device using a conduction method in the related art.

Embodiments of the present disclosure will be described in detail and examples of embodiments are illustrated in the drawings. The same or similar elements and the elements having the same or similar functions are denoted by like reference numerals throughout the descriptions. Embodiments described herein with reference to drawings are explanatory, serve to explain the present disclosure, and are not construed to limit embodiments of the present disclosure. An existing conduction cable is coupled to a conduction feed point of a device under test, the radio frequency matching of the device under test may be changed, which further changes the performance of the antenna and the receiver.

Further, the current may be coupled to the conduction cable, which makes the cable part of the device under test.

Further, in a normal operation mode, interference noise of the device under test can be coupled to the receiver through the antenna, causing an interference to the receiver. However, after a conduction connector is connected, the noise cannot be coupled to the receiver, and thus a test result does not reflect an actual result.

Further, in a 5G wireless terminal, due to limited size and cost of the device under test, there is generally no radio frequency connector left, which makes the conduction test impossible.

Therefore, the conduction test in the related art not only has errors that lead to inaccurate testing, but also has limitations.

The present disclosure provides a method for testing radio frequency performance of a wireless device, which can realize virtual cables based on power level reporting information.

With the method for testing radio frequency performance of a wireless device according to embodiments of the present disclosure, the propagation matrix may be obtained based on the power level reporting information, and the virtual cable is formed between the output port of the instrument and the receiver port of the device under test, to perform the performance test on the device under test and generate the test result of the radio frequency performance. This method may obtain the solution of the virtual cable based on the power level reporting information, thereby improving the accuracy, efficiency, and applicability of the test.

Before describing the method and device for testing radio frequency performance of a wireless device according to embodiments of the present disclosure, how this disclosure is proposed based on knowledge and discovery of inventors on following problems will be described briefly.

Currently, an OTA (over the air) test is mainly used to evaluate the radio frequency performance of the wireless device in an unconnected state (no radio frequency cable is connected to a device under test), to obtain an evaluation on the true radio frequency performance of the wireless device.

In detail, the OTA test has become a standard international test method for evaluating the radio frequency performance of the wireless device. For example, passing OTA certification test to ensure that the performance of wireless electronic products meets the standard without causing interference to the electromagnetic environment is the key to market access. The OTA test may include several standards, e.g., two test standards for a single-input single-output (SISO) system, i.e., total radiated power (TRP) and total isotropic sensitivity (TIS), and a test standard for a multiple-input multiple-output (MIMO) system, i.e., throughput. Domestic development organization of standards of the OTA test is China Communications Standards Association (CCSA), and international development organization of standards of the OTA test is 3rd Generation Partnership Project (3GPP).

Figure 2:
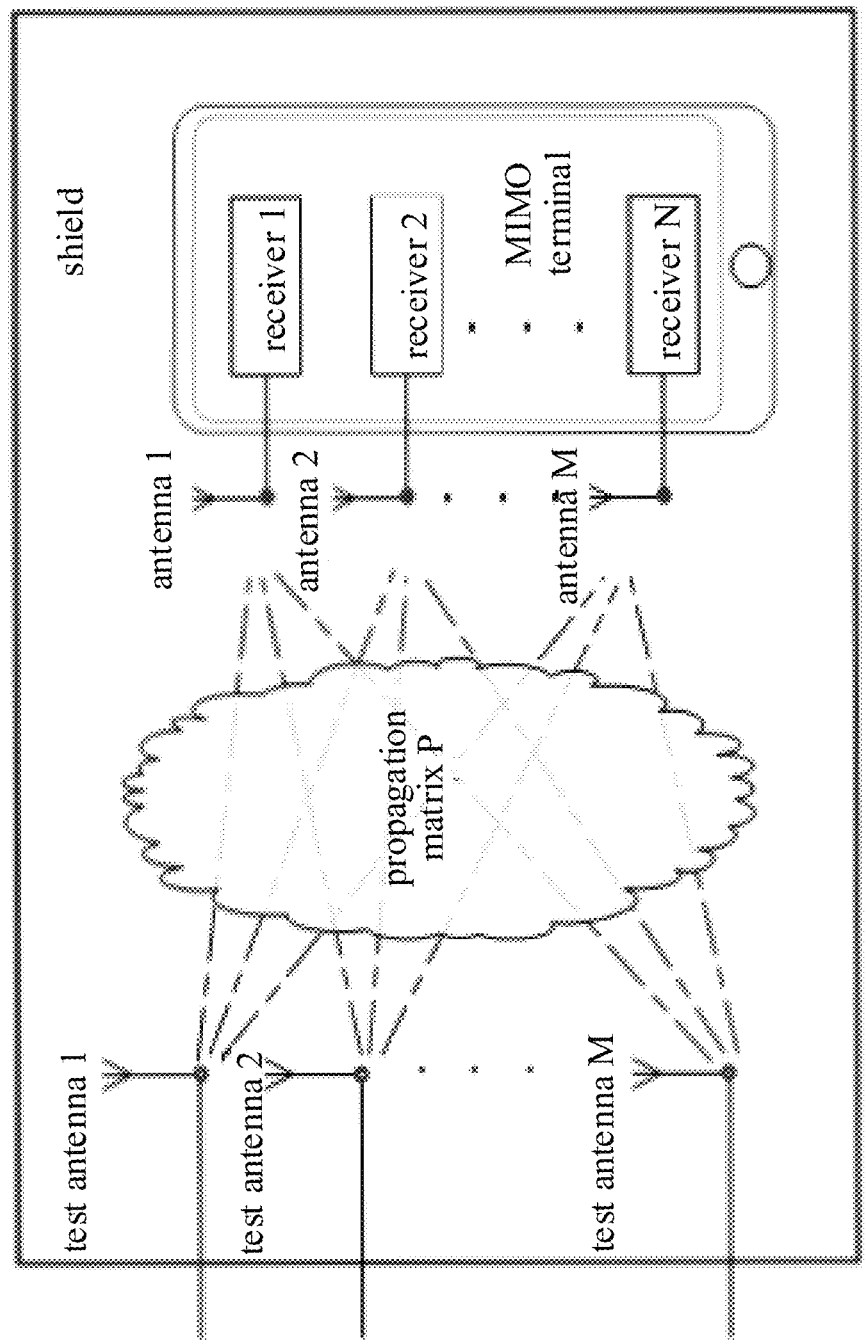
FIG. 2 is a schematic diagram illustrating principles of MIMO OTA test in the related art.

In the MIMO OTA test, "virtual cable" technology is adopted widely. In detail, as illustrated in FIG. 2, a device under test with multiple antennas is placed in a shielded chamber. The number M of test antennas is equal to the number N of antennas of the device under test. Electromagnetic waves are transmitted through the N test antennas and reach N feed points of receiving antennas forming a stable propagation matrix which is represented as propagation matrix P. The propagation matrix P is an N×N matrix.

Figure 3:
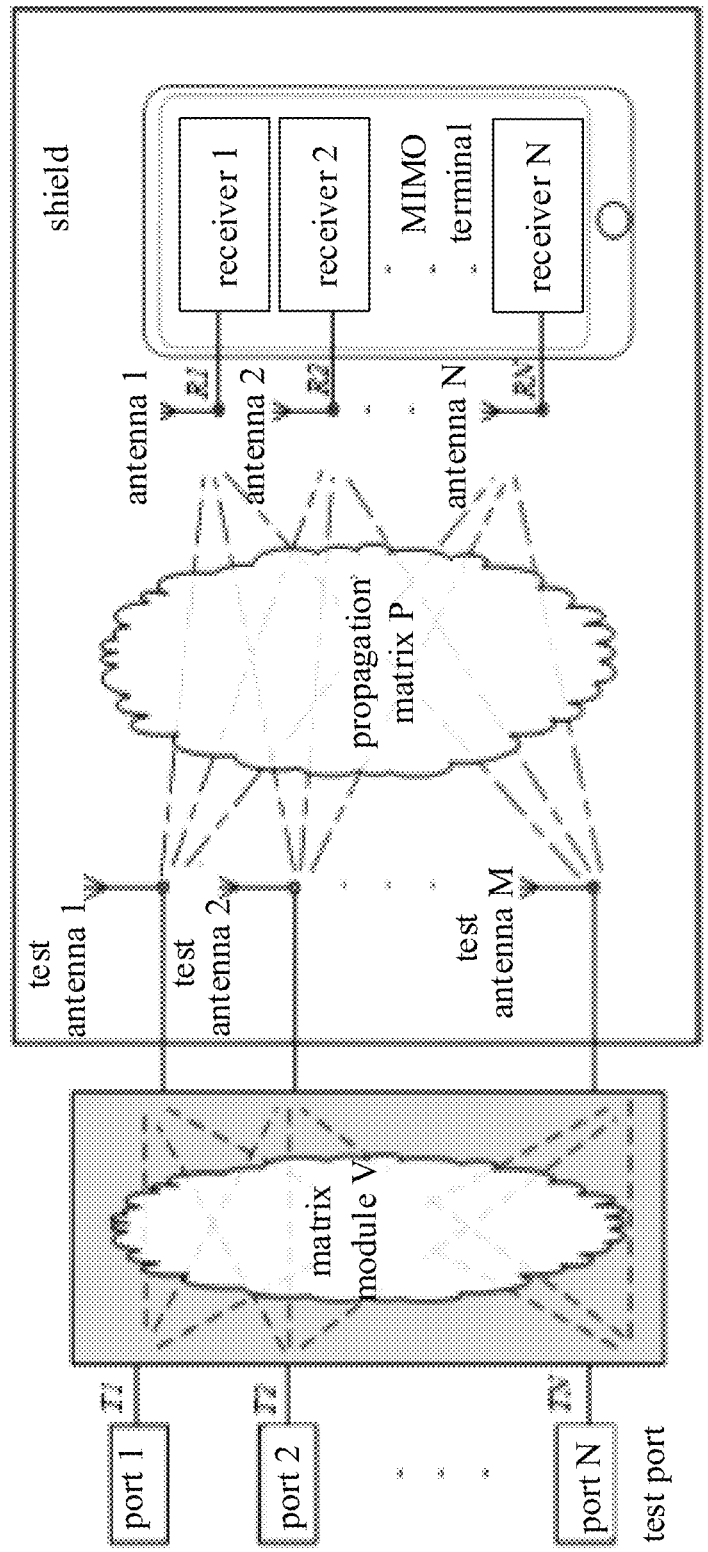
FIG. 3 is a schematic diagram illustrating principles of connecting a radio frequency matrix module to test antennas in the related art.

A radio frequency matrix module is connected to the test antennas. As illustrated in FIG. 3, the value of the radio frequency matrix V is set to be equal to an inverse of the propagation matrix P, that is, $P=V^{-1}$. N signals $(T_1, T_2, \ldots, T_N)$ at the test ports and N received signals $(R_1, R_2, \ldots, R_N)$ at the receiver ports satisfy a following relation:

$(R_1, R_2, \ldots, R_N)^T = P*V*(T_1, T_2, \ldots, T_N)^T = (T_1, T_2, \ldots, T_N)^T$, where, $(\ )^T$ represents transpose of a matrix.

Figure 4:
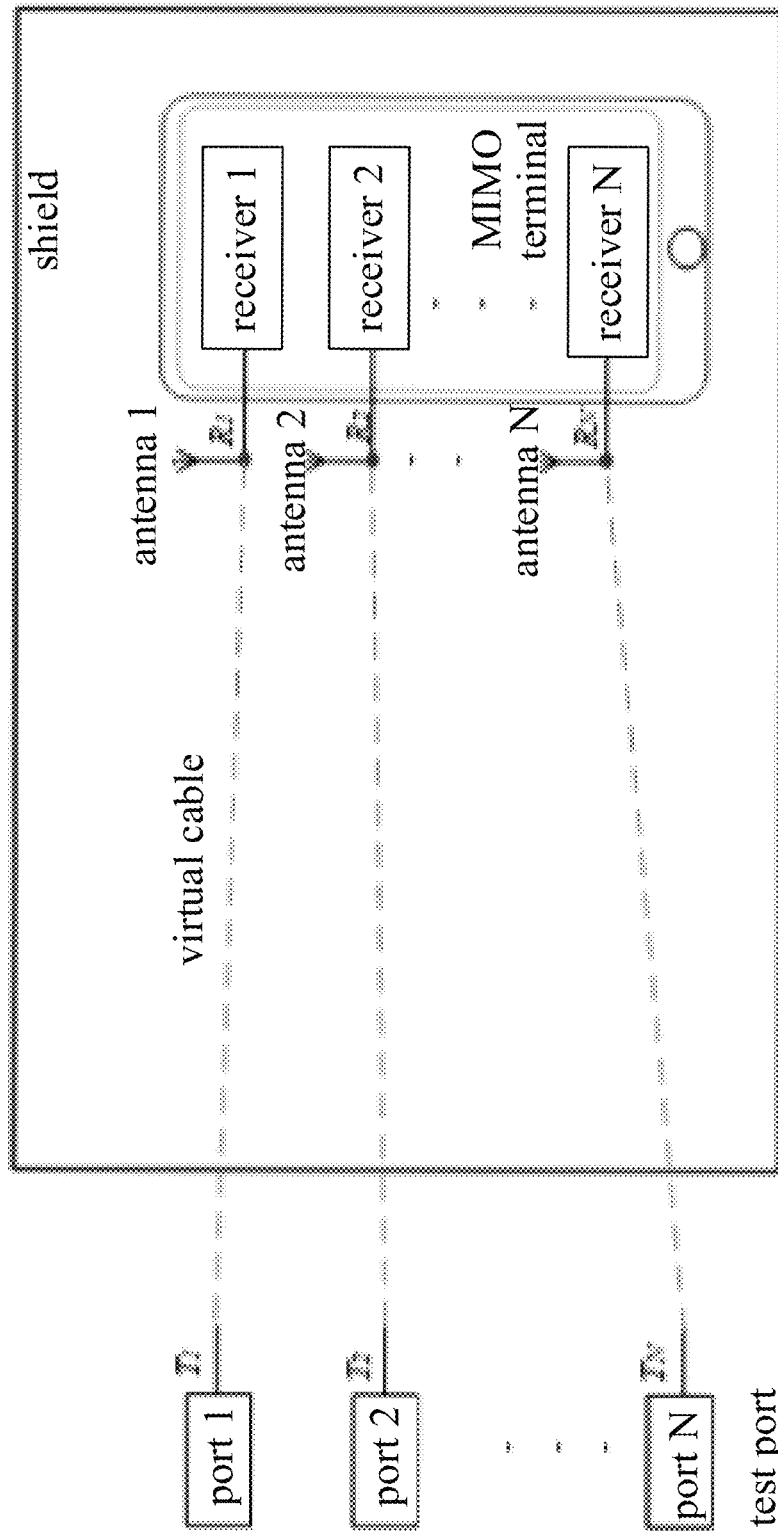
FIG. 4 is a schematic diagram illustrating that test ports and receiver ports are connected by N virtual cables in the related art.

The above formula shows that, with the above setting, the signal from the test port may be directly fed into the receiver port, similar to connecting via conduction cables, except a difference that the device under test is in an independent working state without any connection of intrusive cables. Therefore, the test results are the real working performance. This operating manner is also called "virtual cable" technology. As illustrated in FIG. 4, N virtual cables re connected to the test ports and the receiver ports.

The virtual cable technology may be applied to various tests. One is a radiated two-stage method as an international standard for MIMO testing. For example, a fast, accurate, and economical radiated two-stage method for MIMO OTA test is disclosed in the related art. The radiated two-stage method is to calculate, through a computer, a signal that should reach each receiver (that is, the throughput test signal that should reach each receiver), and directly transmit the test signal to the corresponding receiver through the virtual cable, thus enable simultaneous transmission of multiple signals for throughput test.

Figure 5:
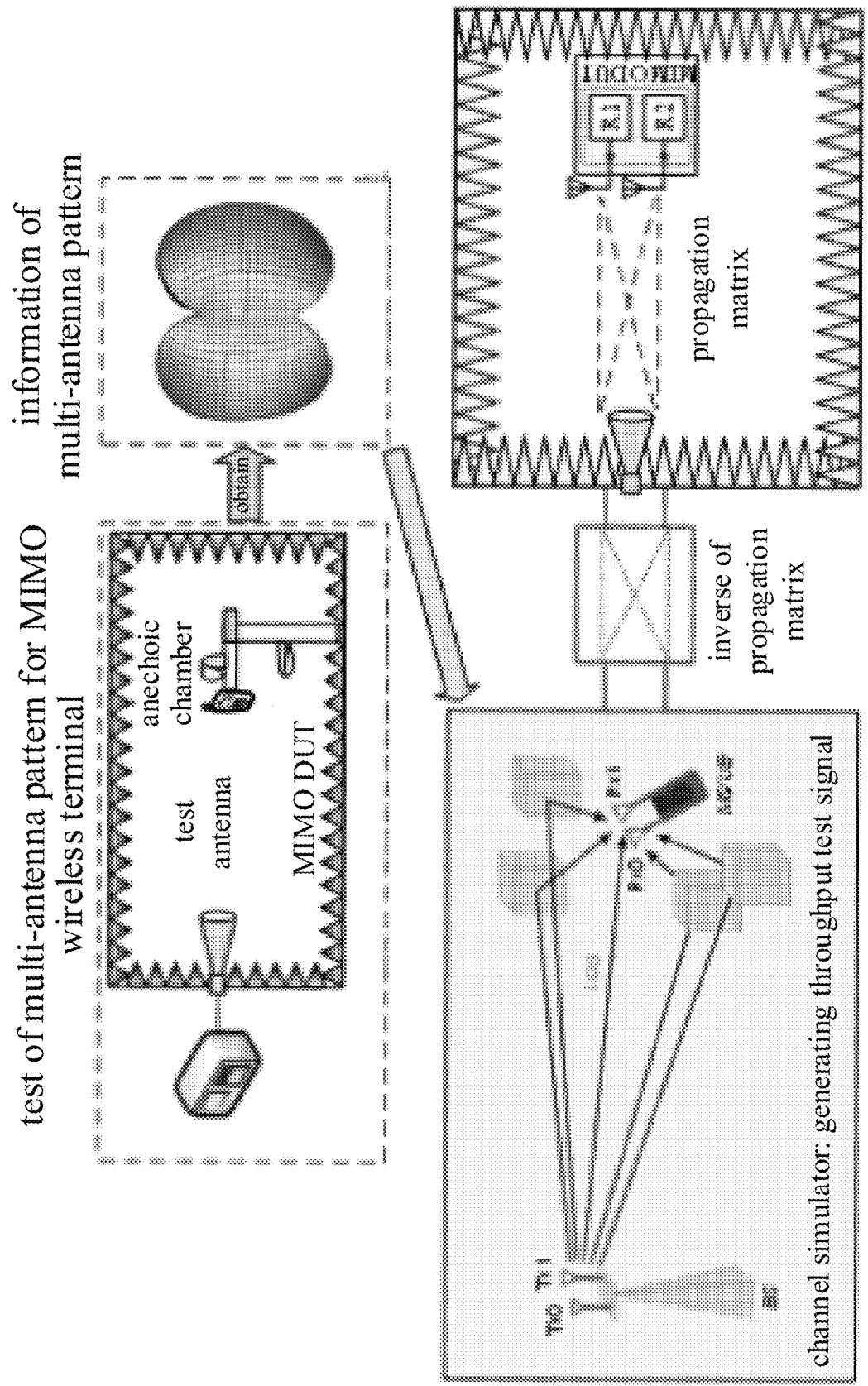
FIG. 5 is a schematic diagram illustrating principles of a radiated two-stage method for a MIMO test in the related art.

In detail, the radiated two-stage method for the MIMO test is illustrated in FIG. 5. The test process mainly includes the following steps.

In the first step, multiple antenna patterns of multiple antennas of a MIMO wireless terminal are obtained.

In the second step, the multiple antenna patterns of the multiple antennas of the wireless terminal are combined with a pre-determined MIMO propagation channel model to obtain a complete MIMO propagation channel by simulation, and to generate a throughput test signal.

In the third step, a propagation matrix is determined for a device under test placed in a shielded chamber, an inverse matrix is obtained based on the propagation matrix, and the inverse matrix is loaded to form a virtual cable between an output port of the channel simulator and a receiver port of the device under test.

In the fourth step, the throughput test signal is transmitted through the virtual cable to test the wireless terminal.

However, in many special cases, it is difficult to implement the virtual cable.

For example, as illustrated in FIG. 2, a spatial propagation matrix P is:

$$P = \begin{bmatrix} p_{11}e^{j\chi_{11}} & p_{12}e^{j\chi_{12}} & \cdots & p_{1N}e^{j\chi_{1N}} \\ p_{21}e^{j\chi_{21}} & p_{22}e^{j\chi_{22}} & \cdots & p_{2N}e^{j\chi_{2N}} \\ \vdots & \vdots & \ddots & \vdots \\ p_{N1}e^{j\chi_{N1}} & p_{N2}e^{j\chi_{N2}} & \cdots & p_{NN}e^{j\chi_{NN}} \end{bmatrix},$$

where, $p_{xy}$ represents a change in amplitude of a signal sent from a $y^{th}$ test antenna to a $x^{th}$ antenna, and $e^{j\chi_{xy}}$ represents a change in phase of the signal sent from the $y^{th}$ test antenna to the $x^{th}$ antenna. In other words, $p_{xy}e^{j\chi_{xy}}$ is the S parameter from the $y^{th}$ test antenna to the $x^{th}$ antenna.

Information of the matrix P should be known to solve the inverse matrix of the spatial propagation matrix P. However, in OTA test, the device under test is not connected to any conduction cable, which means that there is no reference basis used to calculate an absolute phase between the test antenna and the receiver port of the device under test. Therefore, $\chi_{xy}$ of the propagation matrix P is unknown. Therefore, theoretically, the inverse matrix of the matrix P cannot be solved.

The related art, such as "Inverse Matrix Solving Method for Solving Electromagnetic Wave Propagation Matrix Based on Antenna Patterns using 2×2 Inverse Matrix" discloses an inverse matrix solving method based on the information reported by the device under test using the 2×2 radiated two-stage method. However, this method is not applicable for a case of N>2. In addition, the related art, such as "Signal Generation Method and Device based on MIMO Wireless Terminal Test" discloses an inverse matrix solving method based on the information reported by the device under test using the M×N radiated two-stage method. In detail, in this method, amplitude information of the matrix P and phase difference of other elements in each column of the matrix P with respect to a first element of that column may be obtained from the information reported by the device under test. For example, in a first column of the matrix P:

$$\begin{bmatrix} p_{11}e^{j\chi_{11}} \\ p_{21}e^{j\chi_{21}} \\ \vdots \\ p_{N1}e^{j\chi_{N1}} \end{bmatrix},$$

a value of $\chi_{nt}$ relative to $\chi_{11}$ may be obtained based on information reported by the device under test (in this case, the value of $\chi_{11}$ is unknown). The inverse matrix may be solved depending on this reported phase information. This method is suitable for some devices under test. However, the method may have the following defectives.

1. For the device under test that cannot report phase information, it is unable to obtain the phase difference, and thus the calculation cannot be performed. For example, some array antennas or multi-antenna routers do not have an ability to test and report phase information.

2. For the device under test with inaccurate phase reporting, this method is limited, especially when N is relatively large, and thus the accuracy of the phase reporting affects the accuracy of virtual cable solution.

When faced with the above problems, the present disclosure provides a method and a device, for testing radio frequency performance of a wireless device and a related tester.

The method and the device for testing radio frequency performance of a wireless device and the related tester according to embodiments of the present disclosure will be described below with reference to the drawings. In details, the method for testing radio frequency performance of a wireless device according to embodiments of the present disclosure is described with reference to the drawings firstly.

Figure 6:
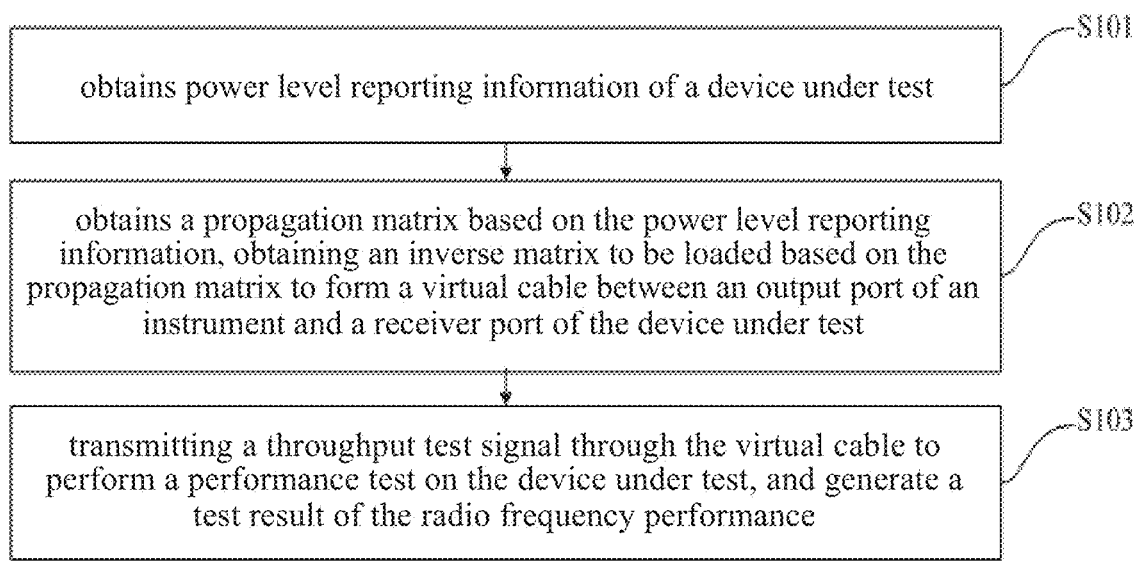
FIG. 6 is a flowchart illustrating a method for testing radio frequency performance of a wireless device according to embodiments of the present disclosure.

FIG. 6 is a flowchart illustrating a method for testing radio frequency performance of a wireless device according to embodiments of the present disclosure.

As illustrated in FIG. 6, the method for testing radio frequency performance of a wireless device may include the following.

At block S101, power level reporting information of a device under test is obtained.

In an embodiment of the present disclosure, the power level reporting information is obtained, by reporting, by the device under test through the antenna, power of the signal received by each receiver, or by storing locally and exporting the power received.

It may be understood that, in embodiments of the present disclosure, it only requires that the device under test provides the power level reporting information. In current communication standard, the device under test generally has a power level reporting function, such as GSM, WiFi, LTE, and ZigBee. However, there is no standard to require the wireless terminal having a phase reporting function. and the test accuracy based on the power level reporting is higher than that based on the phase reporting. Therefore, embodiments of the present disclosure may accurately and universally solve and implement the virtual cables.

At block S102, the propagation matrix is obtained based on the power level reporting information, and an inverse matrix to be loaded is obtained based on the propagation matrix, to form a virtual cable between an output port of an instrument and a receiver port of the device under test.

In an embodiment of the present disclosure, obtaining the propagation matrix based on the power level reporting information includes: obtaining an amplitude value based on the power level reporting information; and obtaining a phase difference of elements in the propagation matrix based on the amplitude value to obtain the propagation matrix.

In an embodiment of the present disclosure, the test is performed based on a formula:

$$\begin{bmatrix} R_1 \\ R_2 \\ \vdots \\ R_N \end{bmatrix} = E^* \begin{bmatrix} T_1 \\ T_2 \\ \vdots \\ T_N \end{bmatrix} = \begin{bmatrix} e^{j\chi_{11}} & 0 & \cdots & 0 \\ 0 & e^{j(\chi_{21})} & \cdots & 0 \\ \vdots & \vdots & \ddots & \vdots \\ 0 & 0 & \cdots & e^{j(\chi_{N1})} \end{bmatrix} * \begin{bmatrix} T_1 \\ T_2 \\ \vdots \\ T_N \end{bmatrix} = \begin{bmatrix} T_1 * e^{j\chi_{11}} \\ T_2 * e^{j\chi_{21}} \\ \vdots \\ T_N * e^{j\chi_{N1}} \end{bmatrix},$$

where, N represents the number of antennas of the device under test, T represents an excitation signal at each test port, R represents the received signal at each receiver port, $e^{j(\chi_{n1})}$ represents the phase information, and E is obtained from the propagation matrix.

In detail, a MIMO device under test with N antennas is placed in a shielded chamber (or an anechoic chamber having a shielding effect). There are more than N test antennas in the shielded chamber, as illustrated in FIG. 3, and the N test antennas are connected to an N×N radio frequency matrix module V. Excite each test port with a unit excitation signal (amplitude and phase equal to each other). The device under test has the power level reporting function. That is, the device under test may report the power level of the signal received by each receiver to the test instrument through the antenna, or the power received may be stored locally and exported.

For example, the inverse matrix is:

$$V = \begin{bmatrix} v_{11}e^{j\lambda_{11}} & v_{12}e^{j\lambda_{12}} & \cdots & v_{1N}e^{j\lambda_{1N}} \\ v_{21}e^{j\lambda_{21}} & v_{22}e^{j\lambda_{22}} & \cdots & v_{2N}e^{j\lambda_{2N}} \\ \vdots & \vdots & \ddots & \vdots \\ v_{N1}e^{j\lambda_{N1}} & v_{N2}e^{j\lambda_{N2}} & \cdots & v_{NN}e^{j\lambda_{NN}} \end{bmatrix}.$$

The propagation matrix P is unknown, and the propagation matrix P may be obtained as follow.

At block 1, the test port keeps the unit excitation signal $(T_1, T_2, \ldots, T_N) = (1, 1, \ldots, 1)$.

Figure 7:
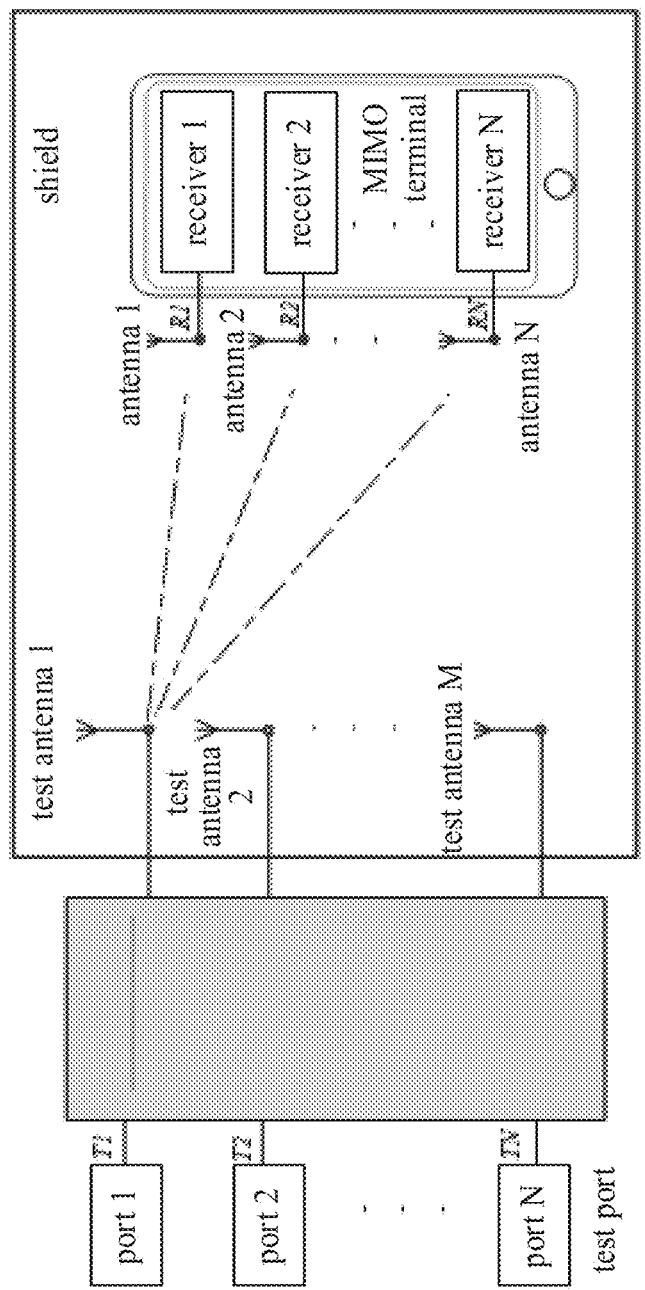
FIG. 7 is a schematic diagram of a signal outputted by test antenna 1 according to embodiments of the present disclosure.

At block 2, the inverse matrix is written as:

$$V = \begin{bmatrix} 1 & 0 & \cdots & 0 \\ 0 & 0 & \cdots & 0 \\ \vdots & \vdots & \ddots & \vdots \\ 0 & 0 & \cdots & 0 \end{bmatrix},$$

meaning that only the test antenna 1 transmits a signal, as illustrated in FIG. 7. The power levels (real number, converted into amplitude values) from the N receivers are obtained. That is, the amplitude information of a first column of the matrix P is:

$$\begin{bmatrix} p_{11} \\ p_{21} \\ \vdots \\ p_{N1} \end{bmatrix}.$$

Figure 8:
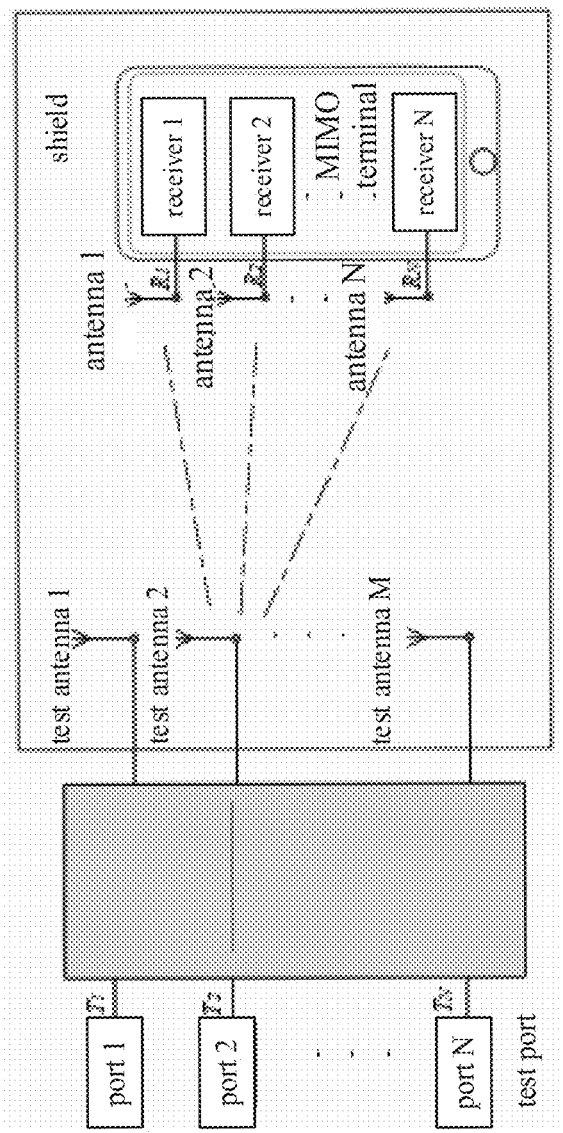
FIG. 8 is a schematic diagram of a signal outputted by test antenna 2 according to embodiments of the present disclosure.

At block 3, the inverse matrix is written as:

$$V = \begin{bmatrix} 0 & 0 & \cdots & 0 \\ 0 & 1 & \cdots & 0 \\ \vdots & \vdots & \ddots & \vdots \\ 0 & 0 & \cdots & 0 \end{bmatrix},$$

meaning that only the test antenna 2 transmits a signal, as illustrated in FIG. 8. The power levels (real numbers, converted into amplitude values) from the N receivers are obtained. That is, the amplitude information of a second column of the matrix P is:

$$\begin{bmatrix} p_{12} \\ p_{22} \\ \vdots \\ p_{N2} \end{bmatrix}.$$

At block 4, the value of each remaining element on the diagonal of the matrix V is replaced with 1 in sequence, while other ones are replaced with 0, all the amplitude information of the entire matrix P may be obtained as:

$$\begin{bmatrix} p_{11} & p_{12} & \cdots & p_{1N} \\ p_{21} & p_{22} & \cdots & p_{2N} \\ \vdots & \vdots & \ddots & \vdots \\ p_{N1} & p_{N2} & \cdots & p_{NN} \end{bmatrix}.$$

Figure 9:
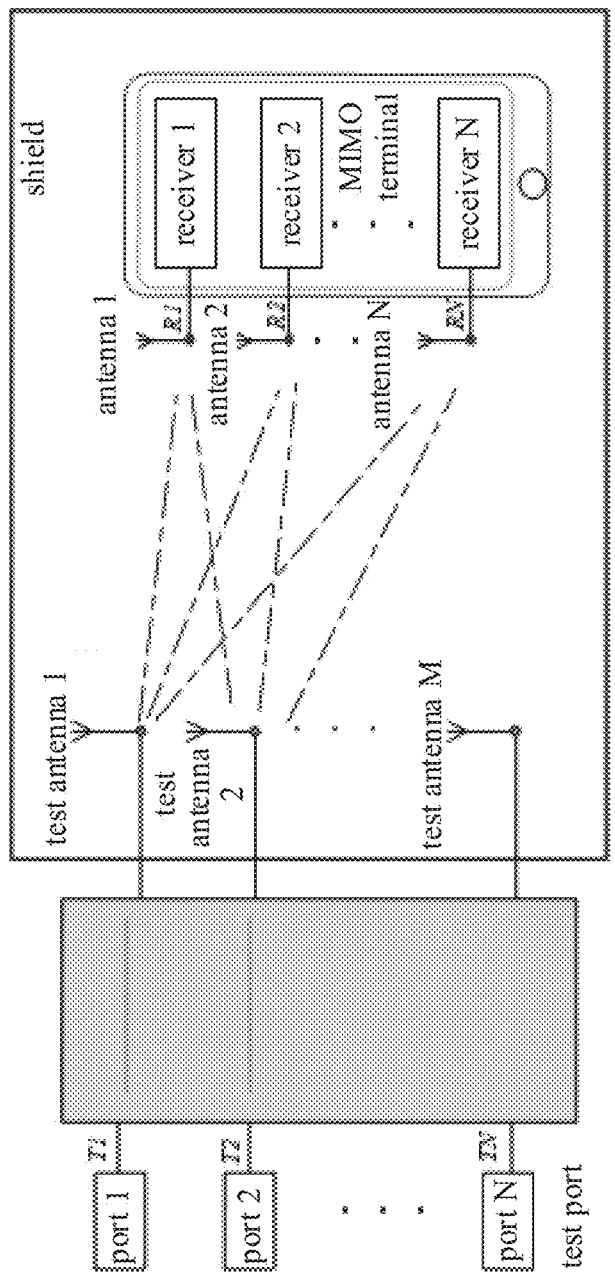
FIG. 9 is a schematic diagram of signals outputted by test antenna 1 and test antenna 2 according to embodiments of the present disclosure.

At block 5, a part of phase information is solved by a power synthesis algorithm, including the following.

a. In the inverse matrix V, $v_{11} e^{j\chi_{11}} = 1$ and $v_{22} e^{j\chi_{22}} = 1$, and others are 0, i.e., $$V = \begin{bmatrix} 1 & 0 & \cdots & 0 \\ 0 & 1 & \cdots & 0 \\ \vdots & \vdots & \ddots & \vdots \\ 0 & 0 & \cdots & 0 \end{bmatrix},$$

meaning that only the test antenna 1 and the test antenna 2 transmit signals, as illustrated in FIG. 9. The power levels (real numbers, converted into amplitude values) from the N receivers are obtained, which is:

$$\begin{bmatrix} Q_1 \\ Q_2 \\ \vdots \\ Q_N \end{bmatrix},$$

in this case, the power of each receiver is a synthesis of those signals on two paths. For example, for the $n^{th}$ receiver, the amplitude of the received signal is:

$$Q_n = \sqrt{p_{n1}^2 + p_{n2}^2 - 2 * p_{n1} * p_{n2} * \cos(\pi - (\chi_{n1} - \chi_{n2}))}.$$

Since $p_{n1}$, $p_{n2}$ and $Q_n$ are obtained in the above blocks, these three may be plugged into the above formula to obtain a value of $\chi_{n1} - \chi_{n2}$. Similarly, based on $$\begin{bmatrix} p_{11} \\ p_{21} \\ \vdots \\ p_{N1} \end{bmatrix}, \begin{bmatrix} p_{12} \\ p_{22} \\ \vdots \\ p_{N2} \end{bmatrix} \text{ and } \begin{bmatrix} Q_1 \\ Q_2 \\ \vdots \\ Q_N \end{bmatrix},$$

the value of $$\begin{bmatrix} \chi_{11} - \chi_{12} \\ \chi_{21} - \chi_{22} \\ \vdots \\ \chi_{N1} - \chi_{N2} \end{bmatrix}$$

may be obtained. That is, for each row of the matrix P, the phase difference of the elements on the second column relative to the elements, on the same row, on the first column may be calculated.

In addition, the value of $v_{22} e^{j\chi_{22}}$ may be set to different values, and the received power level may be obtained to achieve more accurate solution of $$\begin{bmatrix} \chi_{11} - \chi_{12} \\ \chi_{21} - \chi_{22} \\ \vdots \\ \chi_{N1} - \chi_{N2} \end{bmatrix}.$$

For example, the amplitudes of $v_{11}e^{j\lambda_{11}}$ and $v_{22}e^{j\lambda_{22}}$ may be given, and the phase difference of the elements on the second column relative to the elements on the first column may be calculated for each row through a rotation vector method.

b. Similarly, in the inverse matrix V, $v_{11}e^{j\lambda_{11}}=1$, $v_{33}e^{j\lambda_{33}}=1$, and others are 0. The power levels (real numbers, converted into amplitude values) from the N receivers are obtained to solve the value of $$\begin{bmatrix} \chi_{11} - \chi_{13} \\ \chi_{21} - \chi_{23} \\ \vdots \\ \chi_{N1} - \chi_{N3} \end{bmatrix}.$$

That is, for each row of the matrix P, the phase difference of the elements on the third column relative to the elements, on the same row, on the first column can be calculated.

c. Similarly, for each row of the matrix P, the phase difference of the elements on the $N^{th}$ column relative to the elements, on the same row, on the first column can be calculated. Therefore, the matrix P may be:

$$P = \begin{bmatrix} p_{11}e^{j\chi_{11}} & p_{12}e^{j(\theta_{12}+\chi_{11})} & \cdots & p_{1N}e^{j(\theta_{1N}+\chi_{11})} \\ p_{21}e^{j\chi_{21}} & p_{22}e^{j(\theta_{22}+\chi_{21})} & \cdots & p_{2N}e^{j(\theta_{2N}+\chi_{21})} \\ \vdots & \vdots & \ddots & \vdots \\ p_{N1}e^{j\chi_{N1}} & p_{N2}e^{j(\theta_{N2}+\chi_{N1})} & \cdots & p_{NN}e^{j(\theta_{NN}+\chi_{N1})} \end{bmatrix},$$

where, $\partial_{xy}$ is a difference obtained by subtracting the change in the phase of the signal sent from the first test antenna to the $x^{th}$ antenna from the change in the phase of the signal sent from the $y^{th}$ test antenna to the $x^{th}$ antenna, which may be obtained at the block 5, where $$\begin{bmatrix} \chi_{11} \\ \chi_{21} \\ \vdots \\ \chi_{N1} \end{bmatrix}$$

is the change in the phase sent from the first test antenna to all receiving antennas and is unknown.

From the above, the solution of the matrix P is completed. The inverse matrix of P is solved as follows.

The matrix P may be expressed as:

$$P = \begin{bmatrix} p_{11}e^{j\chi_{11}} & p_{12}e^{j(\theta_{12}+\chi_{11})} & \cdots & p_{1N}e^{j(\theta_{1N}+\chi_{11})} \\ p_{21}e^{j\chi_{21}} & p_{22}e^{j(\theta_{22}+\chi_{21})} & \cdots & p_{2N}e^{j(\theta_{2N}+\chi_{21})} \\ \vdots & \vdots & \ddots & \vdots \\ p_{N1}e^{j\chi_{N1}} & p_{N2}e^{j(\theta_{N2}+\chi_{N1})} & \cdots & p_{NN}e^{j(\theta_{NN}+\chi_{N1})} \end{bmatrix} =$$

$$\begin{bmatrix} e^{j\chi_{11}} & 0 & \cdots & 0 \\ 0 & e^{j(\chi_{11})} & \cdots & 0 \\ \vdots & \vdots & \ddots & \vdots \\ 0 & 0 & \cdots & e^{j(\chi_{N1})} \end{bmatrix} \begin{bmatrix} p_{11} & p_{12}e^{j(\theta_{12})} & \cdots & p_{1N}e^{j(\theta_{1N})} \\ p_{21} & p_{22}e^{j(\theta_{22})} & \cdots & p_{2N}e^{j(\theta_{2N})} \\ \vdots & \vdots & \ddots & \vdots \\ p_{N1} & p_{N2}e^{j(\theta_{N2})} & \cdots & p_{NN}e^{j(\theta_{NN})} \end{bmatrix}.$$

where, $$E = \begin{bmatrix} e^{j\chi_{11}} & 0 & \cdots & 0 \\ 0 & e^{j(\chi_{21})} & \cdots & 0 \\ \vdots & \vdots & \ddots & \vdots \\ 0 & 0 & \cdots & e^{j(\chi_{N1})} \end{bmatrix}, \text{ and}$$

$$P_B = \begin{bmatrix} p_{11} & p_{12}e^{j(\theta_{12})} & \cdots & p_{1N}e^{j(\theta_{1N})} \\ p_{21} & p_{22}e^{j(\theta_{22})} & \cdots & p_{2N}e^{j(\theta_{2N})} \\ \vdots & \vdots & \ddots & \vdots \\ p_{N1} & p_{N2}e^{j(\theta_{N2})} & \cdots & p_{NN}e^{j(\theta_{NN})} \end{bmatrix}.$$

The matrix E is unknown, and the matrix $P_B$ is completely known (obtained through the above blocks).

The inverse matrix of the matrix $P_B$ may be obtained as:

$$P_B^{-1} = \begin{bmatrix} p_{11} & p_{12}e^{j(\theta_{12})} & \cdots & p_{1N}e^{j(\theta_{1N})} \\ p_{21} & p_{22}e^{j(\theta_{22})} & \cdots & p_{2N}e^{j(\theta_{2N})} \\ \vdots & \vdots & \ddots & \vdots \\ p_{N1} & p_{N2}e^{j(\theta_{N2})} & \cdots & p_{NN}e^{j(\theta_{NN})} \end{bmatrix}^{-1}.$$

The matrix $P_B^{-1}$ may be imported into the inverse matrix module, that is, $V=P_B^{-1}$.

The relation between the test signals $(T_1, T_2, \ldots, T_N)$ output from the test ports and the signals $(R_1, R_2, \ldots, R_N)$ arriving at the receiver ports is:

$$\begin{bmatrix} R_1 \\ R_2 \\ \vdots \\ R_N \end{bmatrix} = P * V * \begin{bmatrix} T_1 \\ T_2 \\ \vdots \\ T_N \end{bmatrix} = P * P_B^{-1} * \begin{bmatrix} T_1 \\ T_2 \\ \vdots \\ T_N \end{bmatrix}.$$

Bring $P=E*P_B$ to the above formula to obtain:

$$\begin{bmatrix} R_1 \\ R_2 \\ \vdots \\ R_N \end{bmatrix} = E * P_B * P_B^{-1} * \begin{bmatrix} T_1 \\ T_2 \\ \vdots \\ T_N \end{bmatrix} = E * P_B * P_B^{-1} * \begin{bmatrix} T_1 \\ T_2 \\ \vdots \\ T_N \end{bmatrix} = E * \begin{bmatrix} T_1 \\ T_2 \\ \vdots \\ T_N \end{bmatrix}.$$

Bring the matrix E to the above formula to obtain:

$$\begin{bmatrix} R_1 \\ R_2 \\ \vdots \\ R_N \end{bmatrix} =$$

$$E * \begin{bmatrix} T_1 \\ T_2 \\ \vdots \\ T_N \end{bmatrix} = \begin{bmatrix} e^{j\chi_{11}} & 0 & \cdots & 0 \\ 0 & e^{j(\chi_{21})} & \cdots & 0 \\ \vdots & \vdots & \ddots & \vdots \\ 0 & 0 & \cdots & e^{j(\chi_{N1})} \end{bmatrix} * \begin{bmatrix} T_1 \\ T_2 \\ \vdots \\ T_N \end{bmatrix} = \begin{bmatrix} T_1 * e^{j\chi_{11}} \\ T_2 * e^{j\chi_{21}} \\ \vdots \\ T_N * e^{j\chi_{N1}} \end{bmatrix}.$$

Figure 10:
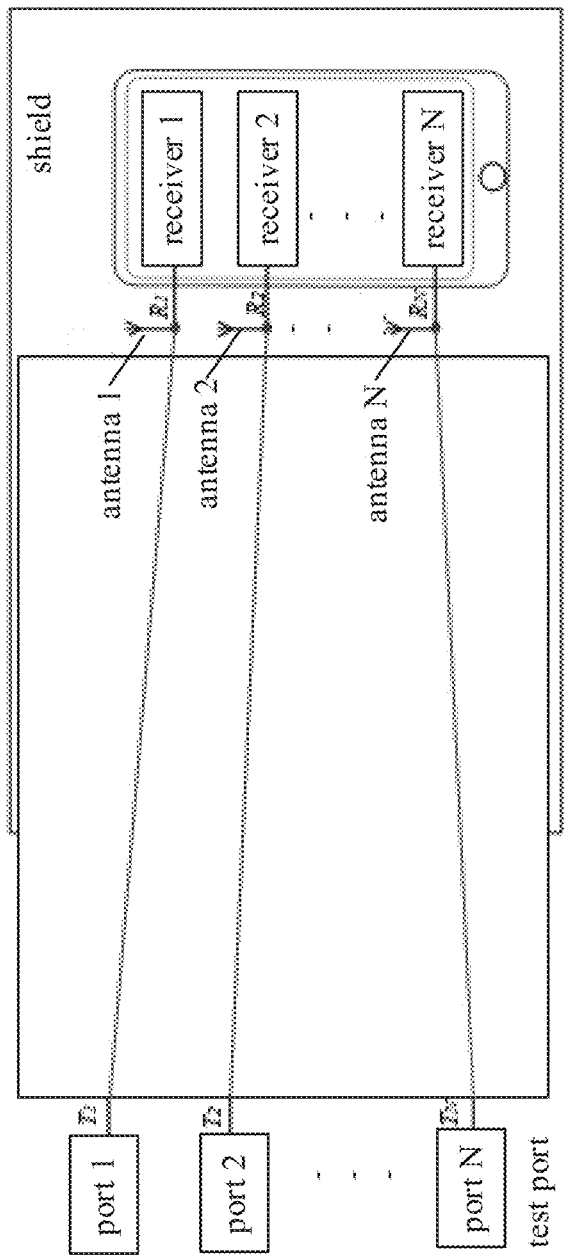
FIG. 10 is a schematic diagram illustrating signal propagations represented by a formula according to embodiments of the present disclosure.

The above formula shows that the received signal of the $n^{th}$ receiver is completely from the $n^{th}$ test port. Although the signal is superimposed with an unknown phase information, this isolated one-to-one signal transmission method is the virtual cable transmission technology. As illustrated in FIG. 10, the signals are transmitted from the test ports to the receivers in a one-to-one manner, as indicated by the formula.

At block S103, a throughput test signal is transmitted through the virtual cable to perform a performance test on the device under test, to generate a test result of the radio frequency performance.

In embodiments of the present disclosure, the solution of the virtual cable is realized when only the power level reporting of the device under test is required, without depending on the phase information. Devices under test of various standards may be used in the method according to embodiments of the present disclosure and the method according to embodiments of the present disclosure may be used in the radiated two-stage method. The method is accurate, requires less steps of solution and is fast.

In addition, in embodiments of the present disclosure, the method further includes: obtaining multiple antenna patterns of multiple antennas of the device under test; and combining the antenna patterns with a pre-determined MIMO propagation channel model to obtain a MIMO propagation channel by simulation and to generate a throughput test signal.

For example, the method according to embodiments of the present disclosure may be used in the radiated two-stage method, which is described in detail below.

Figure 11:
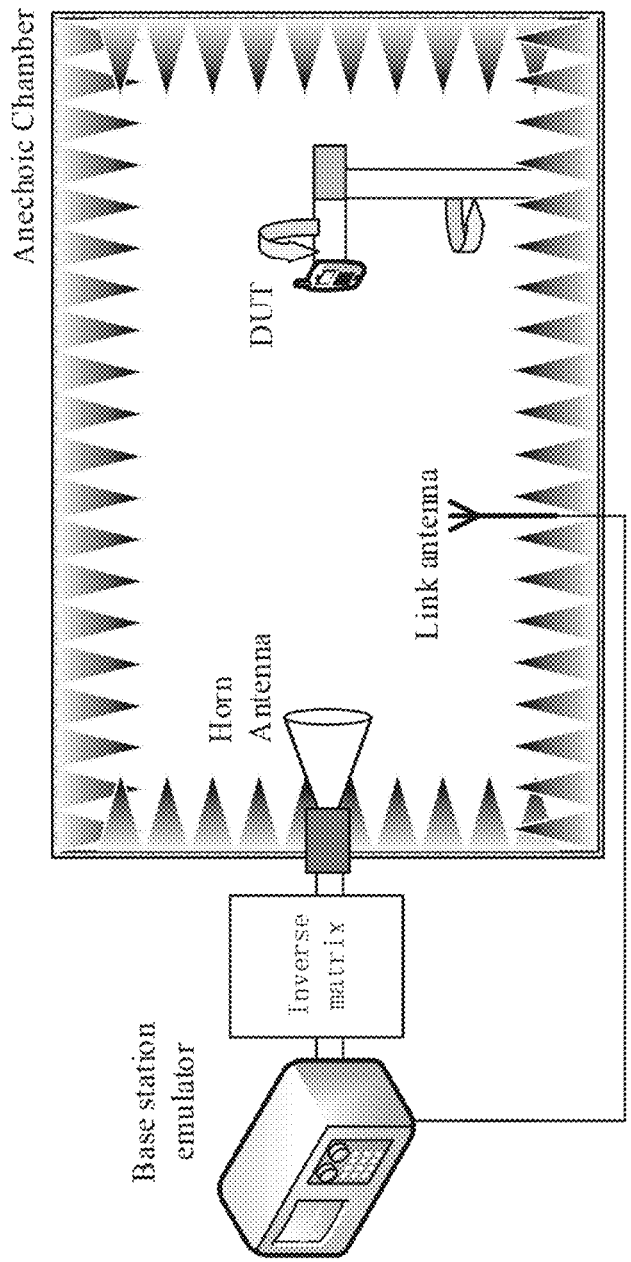
FIG. 11 is a schematic diagram of testing a device under test placed in an anechoic chamber according to embodiments of the present disclosure.

In detail, the device under test is placed in an anechoic chamber, as illustrated in FIG. 11, the method may include the following.

At block 1, multiple antenna patterns of multiple antennas of a MIMO wireless terminal are obtained.

At block 2, the multiple antenna patterns of the multiple antennas of the wireless terminal are combined with a pre-determined MIMO propagation channel model to obtain a complete MIMO propagation channel by simulation and to generate a throughput test signal.

At block 3, a position of the device under test is fixed, and based on the method according to the present disclosure, the propagation matrix in the anechoic chamber is determined based on the power level reporting information of the device under test, thus the inverse matrix to be loaded is determined, the inverse matrix is imported to form a virtual cable between the output port of the instrument and the receiver port of the device under test.

At block 4, the throughput test signal is transmitted through the virtual cable to test the wireless terminal.

With the method for testing radio frequency performance of a wireless device according to embodiments of the present disclosure, the propagation matrix may be obtained based on the power level reporting information, and the virtual cable is formed between the output port of the instrument and the receiver port of the device under test, to perform the performance test on the device under test and generate the test result of the radio frequency performance, without depending on the phase information. By obtaining the solution of the virtual cable based on the power level reporting information, devices under test of various standards may be used in the method according to the present disclosure and the method according to the present disclosure may be used in the radiated two-stage method. The method is accurate, requires less steps of solution and is fast. In addition, this method may improve accuracy, efficiency, and applicability of the test.

A device for testing radio frequency performance of a wireless device according to embodiments of the present disclosure is described with reference to the drawings.

Figure 12:
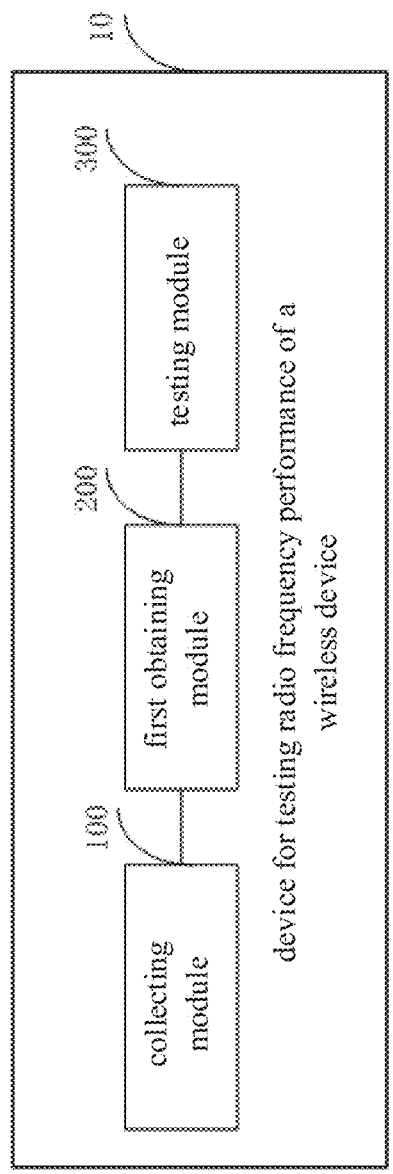
FIG. 12 is a schematic diagram illustrating a device for testing radio frequency performance of a wireless device according to embodiments of the present disclosure.

FIG. 12 is a schematic diagram illustrating a device for testing radio frequency performance of a wireless device according to embodiments of the present disclosure.

As illustrated in FIG. 12, the device 10 for testing radio frequency performance of a wireless device include a collecting module 100, a first obtaining module 200 and a testing module 300.

The collecting module 100 is configured to obtain power level reporting information of a device under test. The first obtaining module 200 is configured to obtain a propagation matrix based on the power level reporting information and obtain an inverse matrix to be loaded based on the propagation matrix to form a virtual cable between an output port of an instrument and a receiver port of the device under test. The testing module 300 is configured to transmit a throughput test signal through the virtual cable to perform a performance test on the device under test and generate a test result of the radio frequency performance. The device 10 may achieve the solution of the virtual cable based on the power level reporting information, thereby improving accuracy, efficiency, and applicability of the test.

In embodiments of the present disclosure, the device 10 according to embodiments of the present disclosure further includes a second obtaining module and a generating module.

The second obtaining module is configured to obtain multiple antenna patterns of multiple antennas of the device under test. The generating module is configured to combine the multiple antenna patterns with a pre-determined MIMO propagation channel model to obtain a MIMO propagation channel by simulation and to generate a throughput test signal.

In an embodiment of the present disclosure, the power level reporting information is obtained by reporting, by the device under test via the antenna, power of a signal received by each receiver, or by storing locally and exporting the power received.

In an embodiment of the present disclosure, the first obtaining module 200 includes an obtaining unit and a computing unit.

The obtaining unit is configured to obtain an amplitude value based on the power level reporting information. The computing module is configured to obtain a phase difference of elements in the propagation matrix based on the amplitude value to obtain the propagation matrix.

It should be noted that, the foregoing explanation of the embodiment of the method for testing radio frequency performance of a wireless device is also applicable for the device for testing radio frequency performance of a wireless device in embodiments, and details are not described herein again.

With the device for testing radio frequency performance of a wireless device according to embodiments of the present disclosure, the propagation matrix may be obtained based on the power level reporting information, and the virtual cable may be formed between the output port of the instrument and the receiver port of the device under test, to perform the performance test on the device under test and generate the test result of the radio frequency performance, without depending on the phase information. By obtaining the solution of the virtual cable based on the power level reporting information, devices under test of various standards may be used and this device may be used in the radiated two-stage method. The device is accurate, requires less steps of solution and is fast. In addition, the device may improve accuracy, efficiency, and applicability of the test.

Embodiments of the present disclosure further provide a tester. The tester includes the above-mentioned device for testing radio frequency performance of a wireless device. The tester may obtain the propagation matrix based on the power level reporting information, and form the virtual cable between an output port of an instrument and a receiver port of the device under test, to perform a performance test on the device under test and generate a test result of the radio frequency performance, without depending on the phase information. By obtaining the solution of the virtual cable based on the power level reporting information, devices under test of various standards may be used and this tester may be used in the radiated two-stage method. This tester is accurate, requires less steps of the solution and is fast. In addition, this tester may improve accuracy, efficiency, and applicability of the test.

In addition, terms such as "first" and "second" are used herein for purposes of description and are not intended to indicate or imply relative importance or significance. Thus, the feature defined with "first" and "second" may comprise one or more this feature. In the description of the present disclosure, "a plurality of" means at least two, for example, two or three, unless specified otherwise.

Reference throughout this specification to "an embodiment," "some embodiments," "an example," "a specific example," or "some examples," means that a particular feature, structure, material, or characteristic described in connection with the embodiment or example is included in at least one embodiment or example of the present disclosure. The appearances of the above phrases in various places throughout this specification are not necessarily referring to the same embodiment or example of the present disclosure. Furthermore, the particular features, structures, materials, or characteristics may be combined in any suitable manner in one or more embodiments or examples. In addition, different embodiments or examples and features of different embodiments or examples described in the specification may be combined by those skilled in the art without mutual contradiction.

Although embodiments of present disclosure have been shown and described above, it should be understood that above embodiments are just explanatory, and cannot be construed to limit the present disclosure, for those skilled in the art, changes, alternatives, and modifications can be made to the embodiments without departing from spirit, principles and scope of the present disclosure.

What is claimed is:

1. A method for testing radio frequency performance of a wireless device, comprising:
   obtaining power level reporting information of a device under test;
   obtaining a propagation matrix based on the power level reporting information, and obtaining an inverse matrix to be loaded based on the propagation matrix to form a virtual cable between an output port of an instrument and a receiver port of the device under test; and
   transmitting a throughput test signal through the virtual cable to perform a performance test on the device under test and obtain a test result of the radio frequency performance,
   wherein obtaining the propagation matrix based on the power level reporting information comprises:
      obtaining an amplitude value based on the power level reporting information; and
      obtaining a phase difference of elements in the propagation matrix based on the amplitude value to obtain the propagation matrix,
   wherein the method further comprises:
      transmitting a first signal through a first test antenna to each receiver of the device under test, obtaining power level reporting information of each receiver, and converting the power level reporting information into a first amplitude value of a received first signal received by each receiver, wherein the first amplitude value of the received first signal corresponds to the first test antenna;
      transmitting a second signal through a second test antenna to each receiver, obtaining power level reporting information of each receiver, and converting the power level reporting information into a second amplitude value of a received second signal received by each receiver, wherein the second amplitude value of the received second signal corresponds to the second test antenna;
      repeating the transmitting a signal, the obtaining the power level reporting information, and the converting the power level reporting information until the amplitude value of a received signal received by each receiver and corresponding to each test antenna is obtained;
      transmitting the first signal through the first test antenna and transmitting the second signal through the second test antenna to each receiver simultaneously, obtaining power level reporting information of each receiver of the device under test, determining an amplitude value of a synthesized signal received by each receiver, and obtaining a phase difference between a received first signal received by each receiver and a received second signal received by each receiver based on the first amplitude value, the second amplitude value and the amplitude value of the synthesized signal; and
      repeating transmitting signals by every two test antennas, obtaining the power level reporting information, determining the amplitude value of the synthesized signal, and obtaining the phase difference until the phase difference between received signals received by each receiver and corresponding to every two test antennas is obtained, so as to obtain the propagation matrix,
   wherein obtaining the inverse matrix to be loaded based on the propagation matrix comprises:
      expressing the propagation matrix based on a following equation:

$$P = \begin{bmatrix} p_{11}e^{j\chi_{11}} & p_{12}e^{j(\theta_{12}+\chi_{11})} & \cdots & p_{1N}e^{j(\theta_{1N}+\chi_{11})} \\ p_{21}e^{j\chi_{21}} & p_{22}e^{j(\theta_{22}+\chi_{21})} & \cdots & p_{2N}e^{j(\theta_{2N}+\chi_{21})} \\ \vdots & \vdots & \ddots & \vdots \\ p_{N1}e^{j\chi_{N1}} & p_{N2}e^{j(\theta_{N2}+\chi_{N1})} & \cdots & p_{NN}e^{j(\theta_{NN}+\chi_{N1})} \end{bmatrix}$$

$$= \begin{bmatrix} e^{j\chi_{11}} & 0 & \cdots & 0 \\ 0 & e^{j(\chi_{21})} & \cdots & 0 \\ \vdots & \vdots & \ddots & \vdots \\ 0 & 0 & \cdots & e^{j(\chi_{N1})} \end{bmatrix} \begin{bmatrix} p_{11} & p_{12}e^{j(\theta_{12})} & \cdots & p_{1N}e^{j(\theta_{1N})} \\ p_{21} & p_{22}e^{j(\theta_{22})} & \cdots & p_{2N}e^{j(\theta_{2N})} \\ \vdots & \vdots & \ddots & \vdots \\ p_{N1} & p_{N2}e^{j(\theta_{N2})} & \cdots & p_{NN}e^{j(\theta_{NN})} \end{bmatrix}$$

$$E = \begin{bmatrix} e^{j\chi_{11}} & 0 & \cdots & 0 \\ 0 & e^{j(\chi_{21})} & \cdots & 0 \\ \vdots & \vdots & \ddots & \vdots \\ 0 & 0 & \cdots & e^{j(\chi_{N1})} \end{bmatrix} \text{ and}$$

$$P_B = \begin{bmatrix} p_{11} & p_{12}e^{j(\theta_{12})} & \cdots & p_{1N}e^{j(\theta_{1N})} \\ p_{21} & p_{22}e^{j(\theta_{22})} & \cdots & p_{2N}e^{j(\theta_{2N})} \\ \vdots & \vdots & \ddots & \vdots \\ p_{N1} & p_{N2}e^{j(\theta_{N2})} & \cdots & p_{NN}e^{j(\theta_{NN})} \end{bmatrix}$$

where N represents the number of test antennas and the number of receivers of the device under test, P is the propagation matrix, $p_{xy}$ represents a change in amplitude of a signal sent from a $y^{th}$ test antenna to an $x^{th}$ receiver, a value range for x and y is 1 to N, $e^{j(\chi_{n1})}$ is phase information associated with a change in phase of the signal sent from the first test antenna to an $n^{th}$ receiver and is unknown, $\partial_{xy}$ is a phase difference obtained by subtracting the change in the phase of the signal sent from the first test antenna to an $x^{th}$ receiver from the change in the phase of the signal sent from a $y^{th}$ test antenna to the $x^{th}$ receiver, E is a matrix of $e^{j(\chi_{n1})}$ obtained from the propagation matrix and is unknown, $P_B$ is a matrix of $p_{xy}$ and $\partial_{xy}$ obtained from the propagation matrix; and obtaining the inverse matrix based on the matrix $P_B$.

2. The method according to claim 1, further comprising:
obtaining multiple antenna patterns of multiple antennas of the device under test; and
combining the multiple antenna patterns with a predetermined MIMO propagation channel model to obtain a MIMO propagation channel by simulation and to generate a throughput test signal.

3. The method according to claim 1, wherein the power level reporting information is obtained by reporting, by the device under test through an antenna, power of a signal received by each receiver, or by storing locally and exporting power received.

4. The method according to claim 1, wherein a test is performed based on a formula:

$$\begin{bmatrix} R_1 \\ R_2 \\ \vdots \\ R_N \end{bmatrix} = E * \begin{bmatrix} T_1 \\ T_2 \\ \vdots \\ T_N \end{bmatrix} = \begin{bmatrix} e^{j\chi_{11}} & 0 & \cdots & 0 \\ 0 & e^{j(\chi_{21})} & \cdots & 0 \\ \vdots & \vdots & \ddots & \vdots \\ 0 & 0 & \cdots & e^{j(\chi_{N1})} \end{bmatrix} * \begin{bmatrix} T_1 \\ T_2 \\ \vdots \\ T_N \end{bmatrix} = \begin{bmatrix} T_1 * e^{j\chi_{11}} \\ T_2 * e^{j\chi_{21}} \\ \vdots \\ T_N * e^{j\chi_{N1}} \end{bmatrix},$$

where, N represents the number of antennas of the device under test, T represents an excitation signal at each test port, R represents a received signal at each receiver port, $e^{j(\chi_{n1})}$ represents phase information, and E is obtained from the propagation matrix.

5. A tester, configured to:
obtain power level reporting information of a device under test;
obtain a propagation matrix based on the power level reporting information, and obtain an inverse matrix to be loaded based on the propagation matrix to form a virtual cable between an output port of an instrument and a receiver port of the device under test; and
transmit a throughput test signal through the virtual cable to perform a performance test on the device under test and obtain a test result of radio frequency performance,
wherein the tester is further configured to:
obtain an amplitude value based on the power level reporting information; and
obtain a phase difference of elements in the propagation matrix based on the amplitude value to obtain the propagation matrix, the tester is further configured to:
transmit a first signal through a first test antenna to each receiver of the device under test, obtain power level reporting information of each receiver, and convert the power level reporting information into a first amplitude value of a received first signal received by each receiver, wherein the first amplitude value of the received first signal corresponds to the first test antenna;
transmit a second signal through a second test antenna to each receiver, obtain power level reporting information of each receiver, and convert the power level reporting information into a second amplitude value of a received second signal received by each receiver, wherein the second amplitude value of the received second signal corresponds to the second test antenna;
repeat the transmitting a signal, the obtaining the power level reporting information, and the converting the power level reporting information until the amplitude value of a received signal received by each receiver and corresponding to each test antenna is obtained;
transmit the first signal through the first test antenna and transmit the second signal through the second test antenna to each receiver simultaneously, obtain power level reporting information of each receiver of the device under test, determine an amplitude value of a synthesized signal received by each receiver, and obtain a phase difference between a received first signal received by each receiver and a received second signal received by each receiver based on the first amplitude value, the second amplitude value and the amplitude value of the synthesized signal; and
repeat transmitting signals by every two test antennas, obtaining the power level reporting information, determining the amplitude value of the synthesized signal, and obtaining the phase difference until the phase difference between received signals received by each receiver and corresponding to every two test antennas is obtained, so as to obtain the propagation matrix,
wherein obtaining the inverse matrix to be loaded based on the propagation matrix comprises:
expressing the propagation matrix based on a following equation:

$$P = \begin{bmatrix} p_{11}e^{j\chi_{11}} & p_{12}e^{j(\theta_{12}+\chi_{11})} & \cdots & p_{1N}e^{j(\theta_{1N}+\chi_{11})} \\ p_{21}e^{j\chi_{21}} & p_{22}e^{j(\theta_{22}+\chi_{21})} & \cdots & p_{2N}e^{j(\theta_{2N}+\chi_{21})} \\ \vdots & \vdots & \ddots & \vdots \\ p_{N1}e^{j\chi_{N1}} & p_{N2}e^{j(\theta_{N2}+\chi_{N1})} & \cdots & p_{NN}e^{j(\theta_{NN}+\chi_{N1})} \end{bmatrix}$$

$$= \begin{bmatrix} e^{j\chi_{11}} & 0 & \cdots & 0 \\ 0 & e^{j(\chi_{21})} & \cdots & 0 \\ \vdots & \vdots & \ddots & \vdots \\ 0 & 0 & \cdots & e^{j(\chi_{N1})} \end{bmatrix} \begin{bmatrix} p_{11} & p_{12}e^{j(\theta_{12})} & \cdots & p_{1N}e^{j(\theta_{1N})} \\ p_{21} & p_{22}e^{j(\theta_{22})} & \cdots & p_{2N}e^{j(\theta_{2N})} \\ \vdots & \vdots & \ddots & \vdots \\ p_{N1} & p_{N2}e^{j(\theta_{N2})} & \cdots & p_{NN}e^{j(\theta_{NN})} \end{bmatrix}$$

$$E = \begin{bmatrix} e^{j\chi_{11}} & 0 & \cdots & 0 \\ 0 & e^{j(\chi_{21})} & \cdots & 0 \\ \vdots & \vdots & \ddots & \vdots \\ 0 & 0 & \cdots & e^{j(\chi_{N1})} \end{bmatrix} \text{ and}$$

$$P_B = \begin{bmatrix} p_{11} & p_{12}e^{j(\theta_{12})} & \cdots & p_{1N}e^{j(\theta_{1N})} \\ p_{21} & p_{22}e^{j(\theta_{22})} & \cdots & p_{2N}e^{j(\theta_{2N})} \\ \vdots & \vdots & \ddots & \vdots \\ p_{N1} & p_{N2}e^{j(\theta_{N2})} & \cdots & p_{NN}e^{j(\theta_{NN})} \end{bmatrix}$$

where N represents the number of test antennas and the number of receivers of the device under test, P is the propagation matrix, $p_{xy}$ represents a change in amplitude of a signal sent from a $y^{th}$ test antenna to an $x^{th}$ receiver, a value range for x and y is 1 to N, $e^{j(\chi_{n1})}$ is phase information associated with a change in phase of the signal sent from the first test antenna to an $n^{th}$ receiver and is unknown, $\partial_{xy}$ is a phase difference obtained by subtracting the change in the phase of the signal sent from the first test antenna to an $x^{th}$ receiver from the change in the phase of the signal sent from a $y^{th}$ test antenna to the $x^{th}$ receiver, E is a matrix of $e^{j(\chi_{n1})}$ obtained from the propagation matrix and is unknown, $P_B$ is a matrix of $p_{xy}$ and $\partial_{xy}$ obtained from the propagation matrix; and obtaining the inverse matrix based on the matrix $P_B$.

6. The tester according to claim 5, further configured to:

obtain multiple antenna patterns of multiple antennas of the device under test; and combine the multiple antenna patterns with a pre-determined MIMO propagation channel model to obtain a MIMO propagation channel by simulation and to generate a throughput test signal.

7. The tester according to claim 5, wherein the power level reporting information is obtained by reporting, by the device under test through an antenna, power of a signal received by each receiver, or by storing locally and exporting power received.

8. The tester of claim 5, wherein a test is performed based on a formula:

$$\begin{bmatrix} R_1 \\ R_2 \\ \vdots \\ R_N \end{bmatrix} = E * \begin{bmatrix} T_1 \\ T_2 \\ \vdots \\ T_N \end{bmatrix} = \begin{bmatrix} e^{j\chi_{11}} & 0 & \cdots & 0 \\ 0 & e^{j(\chi_{21})} & \cdots & 0 \\ \vdots & \vdots & \ddots & \vdots \\ 0 & 0 & \cdots & e^{j(\chi_{N1})} \end{bmatrix} * \begin{bmatrix} T_1 \\ T_2 \\ \vdots \\ T_N \end{bmatrix} = \begin{bmatrix} T_1 * e^{j\chi_{11}} \\ T_2 * e^{j\chi_{21}} \\ \vdots \\ T_N * e^{j\chi_{N1}} \end{bmatrix},$$

where, N represents the number of antennas of the device under test, T represents an excitation signal at each test port, R represents a received signal at each receiver port, $e^{j(\chi_{n1})}$ represents phase information, and E is obtained from the propagation matrix.

9. A non-transitory computer readable storage medium, having instructions stored thereon, wherein when the instructions are executed by a processor, the processor is configured to:

obtain power level reporting information of a device under test;

obtain a propagation matrix based on the power level reporting information, and obtain an inverse matrix to be loaded based on the propagation matrix to form a virtual cable between an output port of an instrument and a receiver port of the device under test; and transmit a throughput test signal through the virtual cable to perform a performance test on the device under test and obtain a test result of radio frequency performance, the processor is further configured to:

obtain an amplitude value based on the power level reporting information; and obtain a phase difference of elements in the propagation matrix based on the amplitude value to obtain the propagation matrix, the processor is further configured to:

transmit a first signal through a first test antenna to each receiver of the device under test, obtain power level reporting information of each receiver, and convert the power level reporting information into a first amplitude value of a received first signal received by each receiver, wherein the first amplitude value of the received first signal corresponds to the first test antenna;

transmit a second signal through a second test antenna to each receiver, obtain power level reporting information of each receiver, and convert the power level reporting information into a second amplitude value of a received second signal received by each receiver, wherein the second amplitude value of the received second signal corresponds to the second test antenna;

repeat the transmitting a signal, the obtaining the power level reporting information, and the converting the power level reporting information until the amplitude value of a received signal received by each receiver and corresponding to each test antenna is obtained;

transmit the first signal through the first test antenna and transmit the second signal through the second test antenna to each receiver simultaneously, obtain power level reporting information of each receiver of the device under test, determine an amplitude value of a synthesized signal received by each receiver, and obtain a phase difference between a received first signal received by each receiver and a received second signal received by each receiver based on the first amplitude value, the second amplitude value and the amplitude value of the synthesized signal; and repeat transmitting signals by every two test antennas, obtaining the power level reporting information, determining the amplitude value of the synthesized signal, and obtaining the phase difference until the phase difference between received signals received by each receiver and corresponding to every two test antennas is obtained, so as to obtain the propagation matrix, wherein obtaining the inverse matrix to be loaded based on the propagation matrix comprises:

expressing the propagation matrix based on a following equation:

$$P = \begin{bmatrix} p_{11}e^{j\chi_{11}} & p_{12}e^{j(\theta_{12}+\chi_{11})} & \cdots & p_{1N}e^{j(\theta_{1N}+\chi_{11})} \\ p_{21}e^{j\chi_{21}} & p_{22}e^{j(\theta_{22}+\chi_{21})} & \cdots & p_{2N}e^{j(\theta_{2N}+\chi_{21})} \\ \vdots & \vdots & \ddots & \vdots \\ p_{N1}e^{j\chi_{N1}} & p_{N2}e^{j(\theta_{N2}+\chi_{N1})} & \cdots & p_{NN}e^{j(\theta_{NN}+\chi_{N1})} \end{bmatrix}$$

$$= \begin{bmatrix} e^{j\chi_{11}} & 0 & \cdots & 0 \\ 0 & e^{j(\chi_{21})} & \cdots & 0 \\ \vdots & \vdots & \ddots & \vdots \\ 0 & 0 & \cdots & e^{j(\chi_{N1})} \end{bmatrix} \begin{bmatrix} p_{11} & p_{12}e^{j(\theta_{12})} & \cdots & p_{1N}e^{j(\theta_{1N})} \\ p_{21} & p_{22}e^{j(\theta_{22})} & \cdots & p_{2N}e^{j(\theta_{2N})} \\ \vdots & \vdots & \ddots & \vdots \\ p_{N1} & p_{N2}e^{j(\theta_{N2})} & \cdots & p_{NN}e^{j(\theta_{NN})} \end{bmatrix}$$

$$E = \begin{bmatrix} e^{j\chi_{11}} & 0 & \cdots & 0 \\ 0 & e^{j(\chi_{21})} & \cdots & 0 \\ \vdots & \vdots & \ddots & \vdots \\ 0 & 0 & \cdots & e^{j(\chi_{N1})} \end{bmatrix} \text{ and}$$

-continued $$P_B = \begin{bmatrix} p_{11} & p_{12}e^{j(\partial_{12})} & \cdots & p_{1N}e^{j(\partial_{1N})} \\ p_{21} & p_{22}e^{j(\partial_{22})} & \cdots & p_{2N}e^{j(\partial_{2N})} \\ \vdots & \vdots & \ddots & \vdots \\ p_{N1} & p_{N2}e^{j(\partial_{N2})} & \cdots & p_{NN}e^{j(\partial_{NN})} \end{bmatrix}$$

where N represents the number of test antennas and the number of receivers of the device under test, P is the propagation matrix, $p_{xy}$ represents a change in amplitude of a signal sent from a $y^{th}$ test antenna to an $x^{th}$ receiver, a value range for x and y is 1 to N, $e^{j(\chi_{n1})}$ is phase information associated with a change in phase of the signal sent from the first test antenna to an $n^{th}$ receiver and is unknown, $\partial_{xy}$ is a phase difference obtained by subtracting the change in the phase of the signal sent from the first test antenna to an $x^{th}$ receiver from the change in the phase of the signal sent from a $y^{th}$ test antenna to the $x^{th}$ receiver, E is a matrix of $e^{j(\chi_{n1})}$ obtained from the propagation matrix and is unknown, $P_B$ is a matrix of $p_{xy}$ and $\partial_{xy}$ obtained from the propagation matrix; and obtaining the inverse matrix based on the matrix $P_B$.

10. The non-transitory computer readable storage medium of claim 9, wherein the processor is further configured to:
    obtain multiple antenna patterns of multiple antennas of the device under test; and
    combine the multiple antenna patterns with a pre-determined MIMO propagation channel model to obtain a MIMO propagation channel by simulation and to generate a throughput test signal.

11. The non-transitory computer readable storage medium of claim 9, wherein the power level reporting information is obtained by reporting, by the device under test through an antenna, power of a signal received by each receiver, or by storing locally and exporting power received.

12. The non-transitory computer readable storage medium of claim 9, wherein a test is performed based on a formula:

$$\begin{bmatrix} R_1 \\ R_2 \\ \vdots \\ R_N \end{bmatrix} = E * \begin{bmatrix} T_1 \\ T_2 \\ \vdots \\ T_N \end{bmatrix} = \begin{bmatrix} e^{j\chi_{11}} & 0 & \cdots & 0 \\ 0 & e^{j(\chi_{21})} & \cdots & 0 \\ \vdots & \vdots & \ddots & \vdots \\ 0 & 0 & \cdots & e^{j(\chi_{N1})} \end{bmatrix} * \begin{bmatrix} T_1 \\ T_2 \\ \vdots \\ T_N \end{bmatrix} = \begin{bmatrix} T_1 * e^{j\chi_{11}} \\ T_2 * e^{j\chi_{21}} \\ \vdots \\ T_N * e^{j\chi_{N1}} \end{bmatrix},$$

where, N represents the number of antennas of the device under test, T represents an excitation signal at each test port, R represents a received signal at each receiver port, $e^{j(\chi_{n1})}$ represents phase information, and E is obtained from the propagation matrix.

* * * * *